US006429547B1

(12) United States Patent
Muroi et al.

(10) Patent No.: US 6,429,547 B1
(45) Date of Patent: Aug. 6, 2002

(54) TIME SWITCH

(75) Inventors: Hiroaki Muroi, Osaka; Kazuo Yanagida, Gunma; Masanori Matsuda, Osaka, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/456,529

(22) Filed: Dec. 8, 1999

(30) Foreign Application Priority Data

Jan. 8, 1999 (JP) ........................................ 11-003393

(51) Int. Cl.[7] .......................... H02J 9/00; H01H 43/02
(52) U.S. Cl. .................................... 307/66; 307/132 R
(58) Field of Search ......................... 307/132 R, 64–66

(56) References Cited

U.S. PATENT DOCUMENTS 5,178,067 A * 1/1993 Collier ...................... 101/405
5,329,082 A 7/1994 Saarem ..................... 200/38 D
5,373,478 A * 12/1994 Komatsu et al. ............ 365/229
5,586,907 A * 12/1996 Frantz et al. ............... 439/500
5,683,164 A * 11/1997 Chien .......................... 362/78
5,922,489 A * 7/1999 Adachi ....................... 429/100

* cited by examiner

*Primary Examiner*—Fritz Fleming
(74) *Attorney, Agent, or Firm*—Armstrong, Westerman & Hattori, LLP

(57) ABSTRACT

A time switch includes a circuit board equipped with a time switch circuit operated by a commercial power source, a battery board to which a back-up battery for supplying a back-up power to the circuit board in case of an interruption of a power supply from the commercial power source is mounted, and a casing in which the circuit board and the battery board are mounted. The battery board is a member separated from the circuit board, or integrally formed with the circuit board by way of an easy-to-break portion having a relatively weak mechanical strength. Thus, the battery board can be detached from the circuit board so that the back-up battery is disposed apart from the circuit board.

5 Claims, 17 Drawing Sheets

TIME SWITCH

BACKGROUND OF THE INVENTION

1. Field of the Invention

This invention relates to a time switch for controlling a load at a predetermined time.

2. Description of the Related Art

FIG. 15 illustrates an example of this kind of time switch as related art. This time switch includes a main casing 11 having a front opened end, a printed circuit board 32' disposed in the main casing 11, and an inner cover plate 12 covering the front opened end of the main casing 11.

The printed circuit board 32' is equipped with a clock function block 21, a terminal block 22 for connecting a load and a load controlling relay 23. The clock function block 21 includes a liquid display for displaying a current time and/or a set time, and so-called rubber switches as push buttons made of an elastic material which utilizes restoring force of elastic material. The circuit board 32' is fitted in and fixed to the main casing 11 by screws 13. The main casing 11 is coved by an outer cover (not shown). The inner cover plate 12 is disposed at the front opened end so as to cover the printed circuit board 32' and fixed to the main casing 11 by tightening screws 14. In this state, the liquid display and the rubber switches of the clock function block 21 are exposed through the opening 12*a* formed in the inner cover plate 12.

As shown in FIG. 16, the clock function block 21 is electrically connected to the printed circuit board 32' via a connection terminal 9 provided on the circuit board 32'. FIG. 17 illustrates a perspective exploded view of the clock function block 21. The clock function block 21 includes an inner casing 21*a,* a main block 21*b* fitted in the inner casing 21*a* from the upper side thereof, a power source board block 21*c* fitted in the inner casing 21*a* from the rear side thereof. A front and rear covers 21*e* and 21*d* are fitted onto the inner casing 21*a* from the upper and rear sides thereof, respectively, to hold the main block 21*b* and the power source board block 21*c* in the inner casing 21*a*.

In the meantime, the time switch is operated by electric power supplied from a commercial power source, and is required to maintain the clock function and the time-schedule setting function even if a power failure is occurred. Thus, in order to maintain these functions in case of a power failure, a battery as a back-up power source is mounted to the power source board block 21*c*. In detail, as shown in FIG. 18, the battery B is attached to a battery fixing board 36' held by a holding plate 21*f*. The holding plate 21*f* has a pair of hooking arms 21*g* for connecting the power source board block 21*c* to the inner casing 21*a*.

The battery B is soldered to the battery fixing board 36' having electrical parts, some of which are connected to the terminals 44*d* provided to the power source board block 21*c*.

As mentioned above, the time switch is provided with a battery B as a back-up power source. In many cases, a nickel-cadmium battery or a lithium battery is used as the back-up power source, and is required to be replaced with a new one when the battery is dead. In the aforementioned structure, in order to replace the battery with a new one, it is required to disassemble many parts, and then to detach the battery soldered to the fixing board 36' therefrom. This requires troublesome works.

Furthermore, in a case where the time switch is to be disposed, the nickel-cadmium battery or the lithium battery mounted therein should be taken out for a separate disposition in order to avoid polluting the environment. However, since troublesome and time-consuming jobs are required to remove the battery, in many cases, the time switch had been disposed without removing the battery.

SUMMARY OF THE INVENTION

An object of the present invention is to provide a time switch equipped with a battery as a back-up power source which is securely mounted and can easily be removed when the battery is replaced with a new one and/or when the time switch is scraped.

According to a first aspect of the present invention, a time switch includes a circuit board equipped with a time switch circuit operated by a commercial power source, a battery board to which a back-up battery for supplying a back-up power to the circuit board in case of an interruption of a power supply from the commercial power source is mounted, and a casing in which the circuit board and the battery board are mounted, wherein the battery board is a member separated from the circuit board.

With this time switch, since the battery board is a member separated from the circuit board, a replacement or disposal of the back-up battery can be easily be performed by detaching the battery board from the circuit board.

According to a second aspect of the present invention, a time switch includes a circuit board equipped with a time switch circuit operated by a commercial power source, a battery board to which a back-up battery for supplying a back-up power to the circuit board in case of an interruption of a power supply from the commercial power source is mounted, and a casing in which the circuit board and the battery board are mounted, wherein the battery board is connected to the circuit board by way of an easy-to-break portion having a relatively weak mechanical strength.

With this embodiment, since the battery board is connected to the circuit board by way of an easy-to-break portion, the manufacturing thereof can be easily performed. Furthermore, since the battery board can easily be detached from the circuit board by breaking the easy-to-break portion, a disposal of the back-up battery can easily be performed.

The easy-to-break portion may be a groove formed along a boundary between the battery board and the circuit board such as a groove having a V-shaped cross-sectional shape.

Other objects and advantages of the present invention will become apparent from the description of the preferred embodiments, which may be modified in any manner without departing from the scope and spirit of the present invention.

DETAILED DESCRIPTION OF THE PREFERRED EMBODIMENTS

Preferred embodiments of a time switch according to the present invention will now be described in detail with reference to the accompanying drawings.

First Embodiment

FIGS. 1 to 11 show a time switch according to a first embodiment of the present invention.

Figure 2:
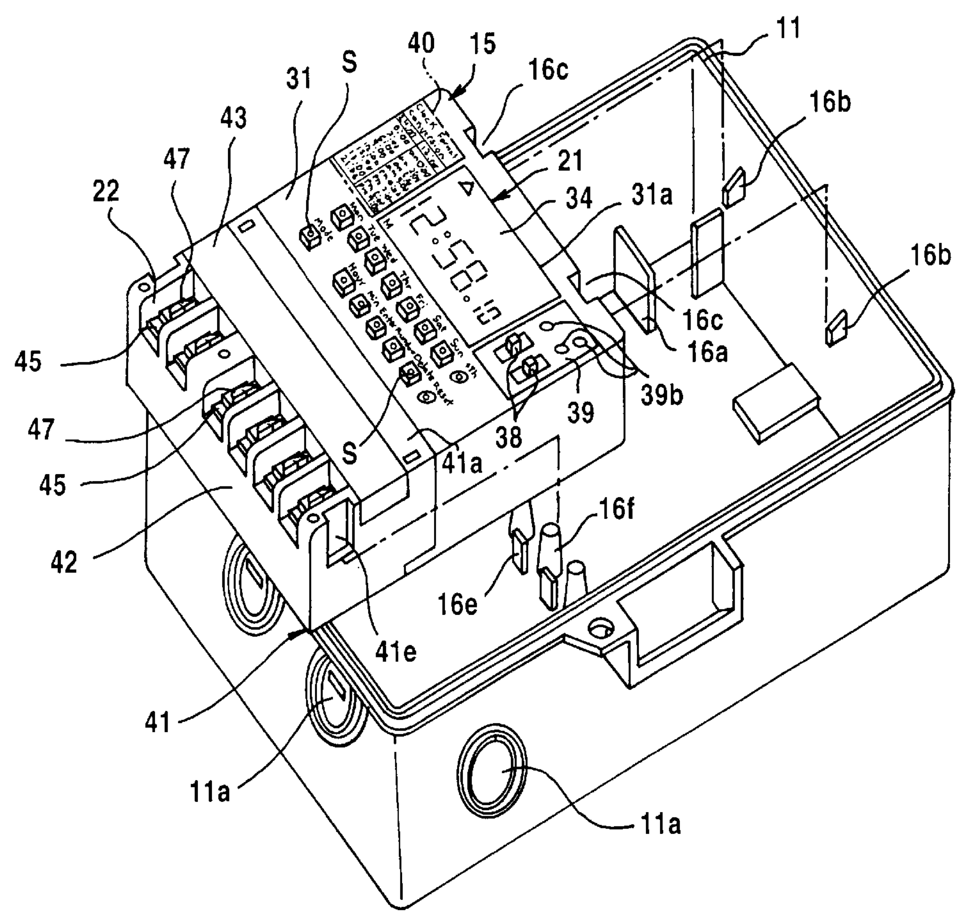
FIG. 2 is a perspective view of the main portion in a state that the main portion is detached from an outer casing.
Figure 3:
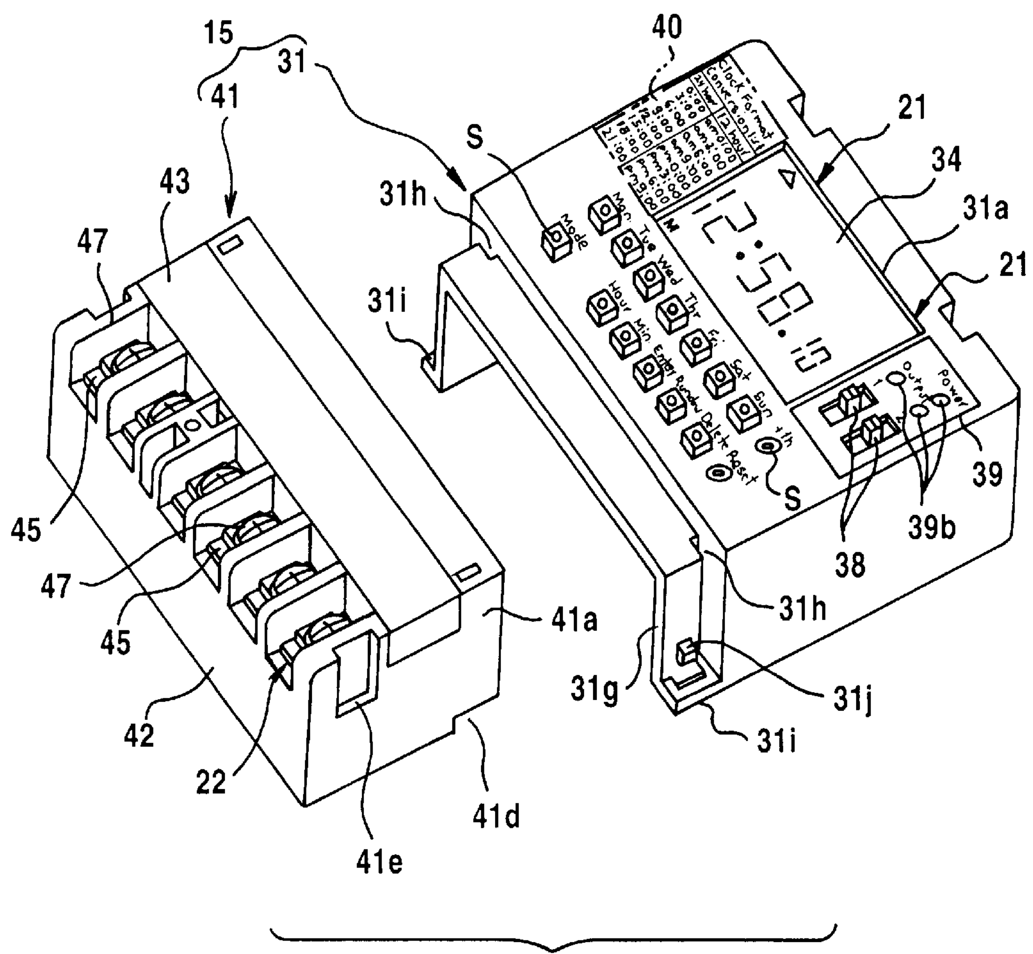
FIG. 3 is a perspective view of the main portion in a state that a terminal holder is detached from the inner main casing.

As shown in FIG. 2, the time switch includes a front cover (not shown), an outer main casing 11 and an inner casing 15 mounted in the outer main casing 11. The inner casing 15 is comprised of an inner main casing 31 and a terminal holder 41 detachably connected to the inner main casing 31 as shown in FIGS. 2 and 3. The inner main casing 31 has a clock function block 21 including an electric timer circuit. The terminal holder 41 includes a terminal block 22 to which a power source and loads are connected and a load controlling relay 23 (see FIG. 6).

Figure 1:
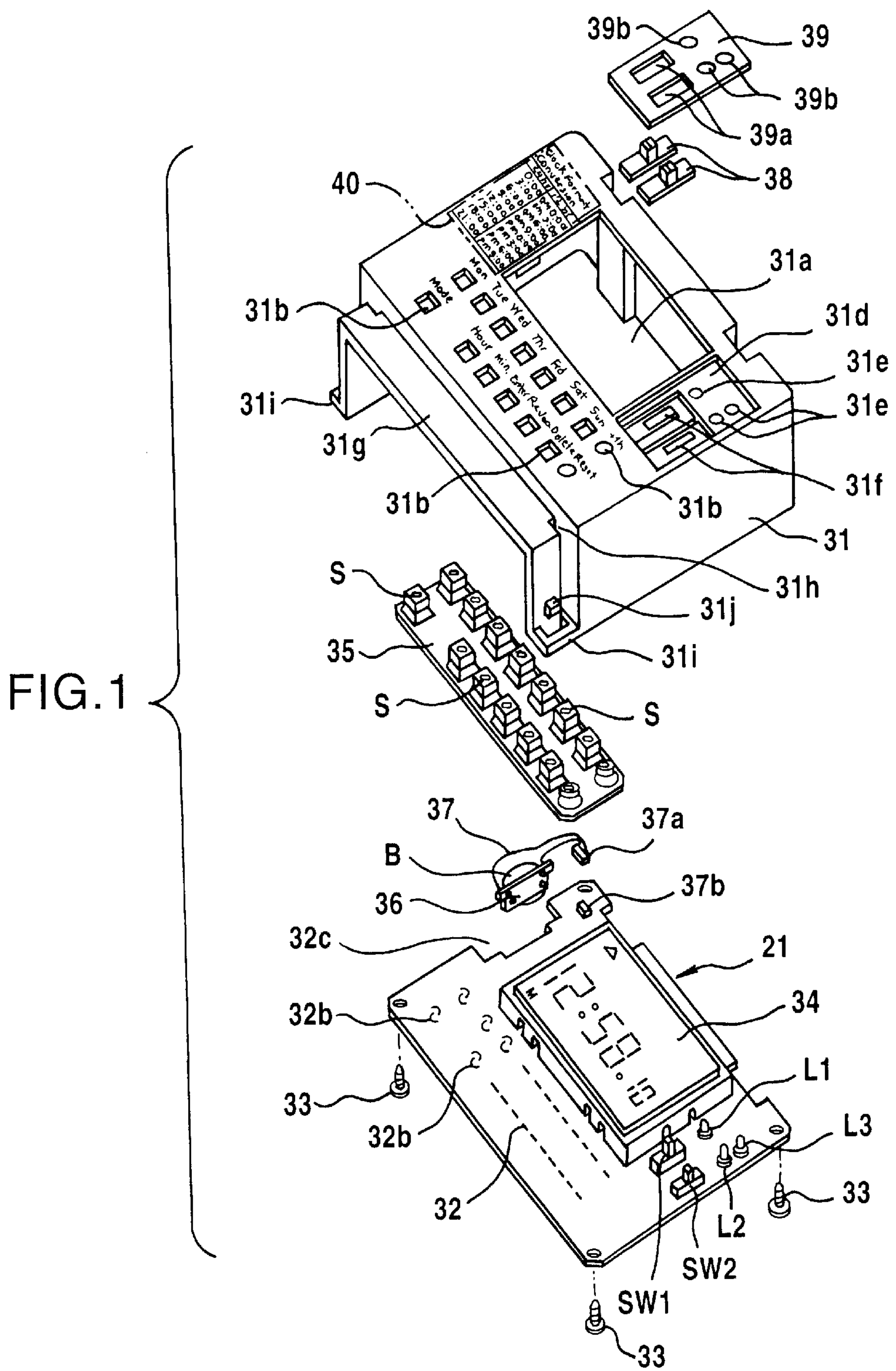
FIG. 1 is an exploded perspective view of a main portion of a time switch according to a first embodiment of the present invention.
Figure 4:
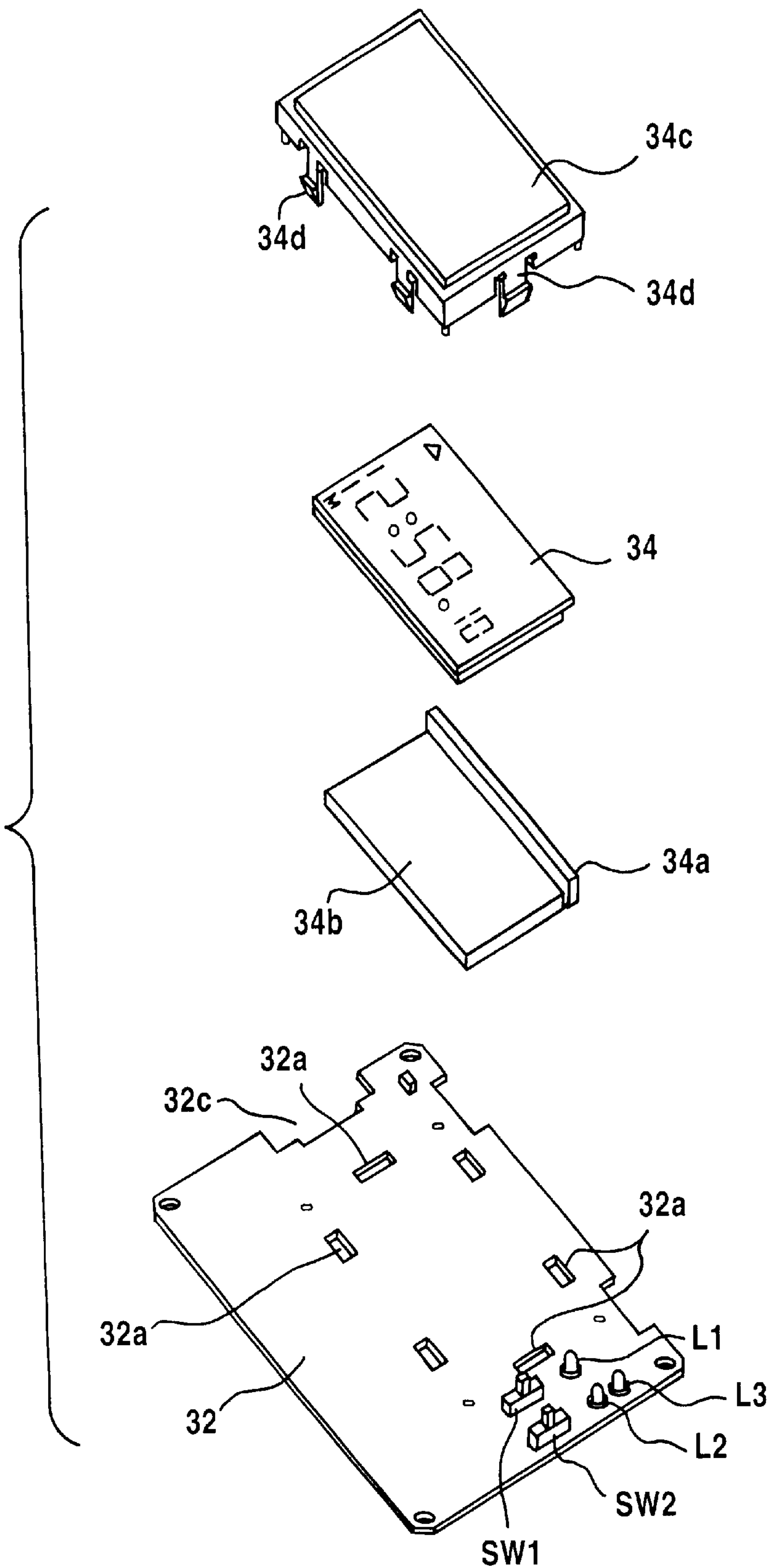
FIG. 4 is an exploded perspective view of the clock function block.

As shown in FIG. 1, the inner main casing 31 is a box-shaped casing with a lower opened end and a rear opened end, and covers a printed circuit board 32 equipped with the clock function block 21. The printed circuit board 32 is fixed to the inner main casing 31 by tightening screws 33 inserted through the printed circuit board 32 from the rear side thereof. The printed circuit board 32 is equipped with a liquid crystal display (hereinafter referred to as "LCD") 34. As shown in FIG. 4, the LCD 34 is electrically connected to the printed electric circuits of the printed circuit board 32 via a connector plate 34*a* made of conductive rubber. Between the LCD 34 and the printed circuit board 32, a sponge-like cushion sheet 34*b* is disposed. The LCD 34 is secured to the printed circuit board 32 by a shallow box-shaped display casing 34*c* made of transparent resin. The LCD 34 is secured to the printed circuit board 32 via the cushion sheet 34*b* and the connector plate 34*a* by fixing the display casing 34*c* in such a state that the LCD 34 and the connector plate 34*a* are fitted in the display casing 34*c*. Thus, the LCD 34 is electrically connected to the printed circuit board 32. The display casing 34*c* is secured to the printed circuit board 32 by engaging the engaging ledges 34*d* formed at the rear peripheral edges of the display casing 34*c* with the corresponding engaging holes 32*a* provided in the printed circuit board 32.

The time switch according to this embodiment is provided with a plurality of operation buttons S for setting the current time and for setting the time for controlling the loads connected to the time switch. As shown in FIG. 1, these operation buttons S are integrally formed on a front surface of the sheet member 35 having rubber elasticity disposed on the printed circuit board 32. The sheet member 35 has, at its rear surface, a plurality of tapered dented portions (not shown) each formed at a portion corresponding to the operation buttons 8. Each of the tapered dented portions has a tapered peripheral wall gradually decreasing the thickness from the rear surface of the sheet member 35 toward the front surface thereof. At the bottom of each dented portion, a conductive movable contact member (not shown) is fixed such that the rear surface thereof is inwardly located as compared to the rear surface of the sheet member 35. Accordingly, when the operation button S is depressed, the peripheral wall of the dented portion corresponding to the depressed operation button S is warped downward to cause the downward movement of the movable contact member. Thus, the movable contact member protrudes from the rear surface of the sheet member 35 toward the printed circuit board 32.

From this state, when the depressing force of the operation button S is released, the movable contact member returns to its original position. As shown in FIG. 1, the printed circuit board 32 has a plurality of pairs of conductive printed patterns 32*b* each pair comprising a combination of a U-shaped conductive printed pattern and an inverted U-shaped conductive printed pattern.

When the operation button S is depressed, the movable contact member contacts to a corresponding pair of U-shaped conductive printed patterns 32*b* to cause an electrical conduct of the pair of U-shaped conductive printed patterns 32*b*. This functions as a momentary-type press button, i.e., a button which becomes ON state only when the button is being depressed. Thus, a so-called rubber switch is formed by the sheet member 35 and the printed circuit board 32.

The inner main casing 31 has a display window 31*a* for exposing the LCD 34 at the front wall and a plurality of operation openings 31*b* for the operation buttons S. The sheet member 35 is attached to the inner main casing 31 in a state that a portion of the sheet member 35 other than the operation buttons S is pressed against the inner surface of the inner main casing 31 by the printed circuit board 32.

As will be mentioned later, in this embodiment, the time switch can individually control each of two circuit loads. In detail, the time switch can select any one operation mode among the first to third operation modes (1) to (3), i.e., the first operation mode (2) in which each load can be individually turned ON and OFF by the timer circuit, the second operation mode (2) in which all loads are kept in an ON-state regardless of the operation of the timer circuit, and the third operation mode (3) in which all loads are kept in an OFF-state regardless of the operation of the timer circuit. The selection of the operation mode is performed by slide switches SW1 and SW2 equipped on the printed circuit board 32 and provided for each timer circuit. The printed circuit board 32 has two operation pilot lamps L1 and L2 each made of a light-emitting diode for showing the operation state of each timer circuit, and one power pilot lamp L3 for showing the power ON/OFF state.

Figure 5:
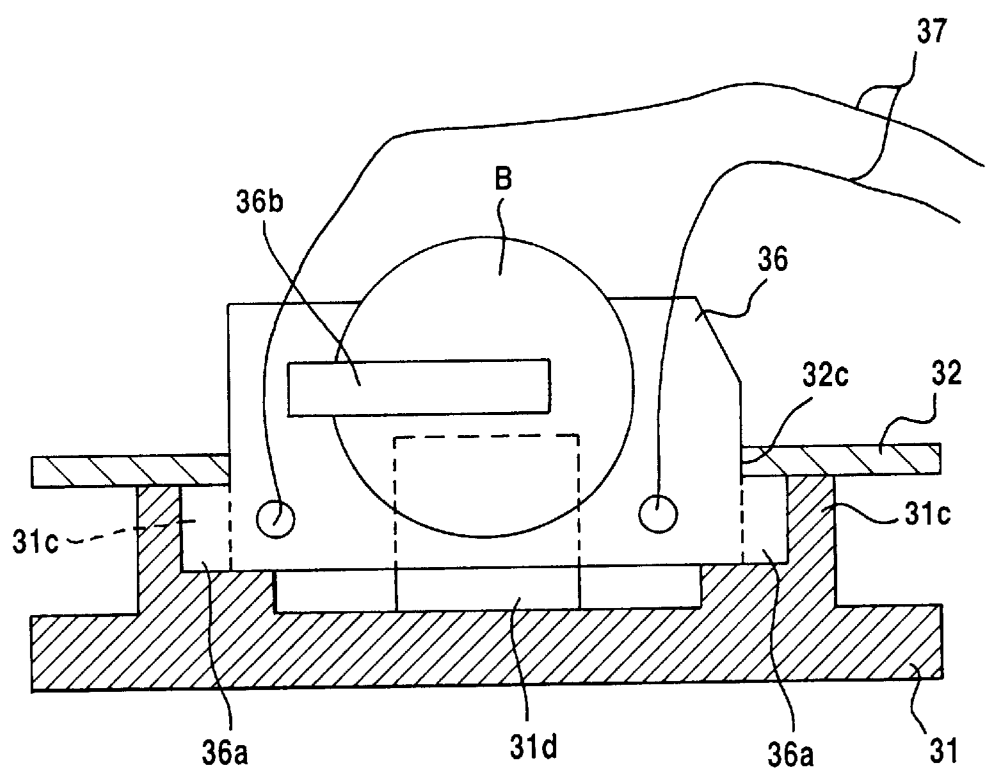
FIG. 5 is an enlarged side view of the battery mounting portion.

The clock function block 21 is provided with a battery B, such as a lithium battery, as a back-up power source in case of a power failure of the commercial power source. The battery B is provided to a battery board 36 which is separated from the printed circuit board 32. As shown in FIG. 5, the battery board 36 is equipped with a contact plate 36*b* connected to one of the electrodes of the battery B. As mentioned above, the battery board 36 is a member separated or detached from the printed circuit board 32. As shown in FIG. 5, the battery board 36 is held by holding ribs 31*c*, 31*c* and 31*d* each upwardly protruding from the inner surface of the inner main casing 31. Furthermore, a pair of fixing ledges 36*a* and 36*a* extending from the side edges of the battery board 36 are cramped therebetween by the printed circuit board 32 and the inner main casing 31. Thus, the battery board 36 is securely fixed to the inner main casing 31. Each holding rib 31*c* has a generally U-shaped cross-sectional slot for fitting the fixing ledge 36*a* of the battery board 36, and the holding rib 31*d* supports the battery board 36 by fitting on the central side portion thereof. According to the aforementioned holding ribs 31*c*, 31*c* and 31*d*, the positioning of the battery board 36 to the inner main casing 31 can easily be performed, resulting in an easy assembling of the battery board 36. In addition, even if vibrations or impacts are imparted, the battery board 36 is prevented from being detached from the inner main casing 31, and a large impact force is also prevented from being imparted to the printed circuit board 32. As shown in FIG. 1, the printed circuit board 32 has, at its side portion corresponding to the fixing portion of the battery board 36, a cut-out portion 32*c* having a shape corresponding to the shape of the battery board 36. Thus, as shown in FIG. 5, the battery board 36 is fitted in the cut-out portion 32*c* with the opposite side edges of the battery board 36 butted to the opposite inner edges of the cut-out portion 32*c*, whereby the battery board 36 is prevented from being shifted.

As shown in FIGS. 1 and 5, the battery board 32 is electrically connected to the printed circuit board 36 by way of electric wires 37 having a connector (receptacle) 37*a* at one end. The printed circuit board 32 has a connector (post) 37*b* for detachably connecting the connector (receptacle) 37*a*. Therefore, in a case where the battery B is disposed, the battery board 36 can be detached from the printed circuit board 32 by disconnecting connectors 37*a* and 37*b*. Thus, the battery B can easily and safely be disposed, which in turn avoids the pollution of the environment due to the contents of the battery B and enhances the reuse of the contents of the battery B.

The inner main casing 31 has a dented portion 31*d* at the right hand side portion of the display window 31*a*. Provided at the bottom of the dented portion 31*d* are openings 31*e* for fitting the operation pilot lamps L1 and L2 and the power pilot lamp L3 and openings 31*f* and 31*f* for fitting operation handles 38 of switches SW1 and SW2. A display sheet 39 made of transparent material is disposed in the dented portion 31*d* and adhered thereto by gluing or fusing. In a case where two switches SW1 and SW2 are provided to the time switch as described above, the display sheet 39 should have two openings 39*a* for the operation handles 38 and three openings 39*b* for the three pilot lamps L1, L2 and L3 so that these pilot lamps can be visually confirmed. In a case where a single switch SW1 or SW2 is provided to the time switch, the display sheet 39 should have a single opening 39*a* for the handle of the switch and three openings 39*b* for the pilot lamps L1, L2 and L3. As it is understood from the above, by selecting an appropriate one of the display sheets 39 having a different number of openings 39*a* and applying it to an inner main casing 31 having a maximum number of openings 31*f*, the inner main casing 31 can be commonly used for any type of time switches having a different number of the switches SW1, SW2. The relationship between the display sheet 39 and the inner main casing 31 is not limited to the aforementioned embodiment. For example, the maximum number of openings for the switch handles and the pilot lamps may be provided to the inner main casing 31, and some of the openings which are not in use may be covered by the display sheet 39.

On the front surface of the inner main casing 31 at the left side of the display window 31*a*, a time conversion table 40 showing the relationship between the 24-hour scale and the 12-hour scale is provided. In the time conversion table, the 24-hour scale and the 12-hour scale are provided side by side so that the user can easily convert the two scales. The 12-hour scale is accompanied by the letters, "am" or "pm". For example, if the 24-hour scale is shown as: 0:00; 3:00; 6:00; 9:00; 12:00; 15:00; 18:00; and 21:00, the 12-hour scale will be shown as: 0:00am; 3:00am; 6:00am; 9:00am; 0:00pm; 3:00pm; 6:00pm; and 9:00pm. This table enables the user, who lives in a country or region where the 12-hour scale is mainly employed, to use the time switch employing the 24-hour scale display. In other words, the user can easily convert the time scale displayed on the LCD 34 in the 24-hour scale into the 12-hour scale. Thus, even if the user is not familiar with the 24-hour scale, the user can correctly set the time switch by converting the 24-hour scale displayed on the display 34 into the 12-hour scale.

The time conversion table 40 may be printed by silk printing method or a tampon printing method. Alternatively, a sheet on which the time conversion table 40 is printed may be adhered to the inner main casing 31. In a case where the time conversion table 40 is provided, the description or appearance of the time scale displayed on the LCD 34 may preferably be the same as in the time conversion table 40 to enable an easy conversion of the time scale by utilizing the time comparison table 40.

As already mentioned above, the terminal holder 41 is connected to the inner main casing 31. As shown in FIG. 3, the inner main casing 31 has a channel-shaped connection portion 31*g* protruding from the lower edge thereof. The connection portion 31*g* is provided with a pair of guide grooves 31*h* extending in the fore and aft direction (i.e., in the up-and-down direction as shown in FIG. 3) at the basal end of the connection portion 31*g*. The connection portion 31*g* is provided with a pair of outwardly protruded flange portions 31*i* and 31*i* formed at the rear ends thereof and a pair of outwardly protruded engaging protrusions 31*j* and 31*j* formed at the side surface of the connection portion 31*g*.

Figure 8:
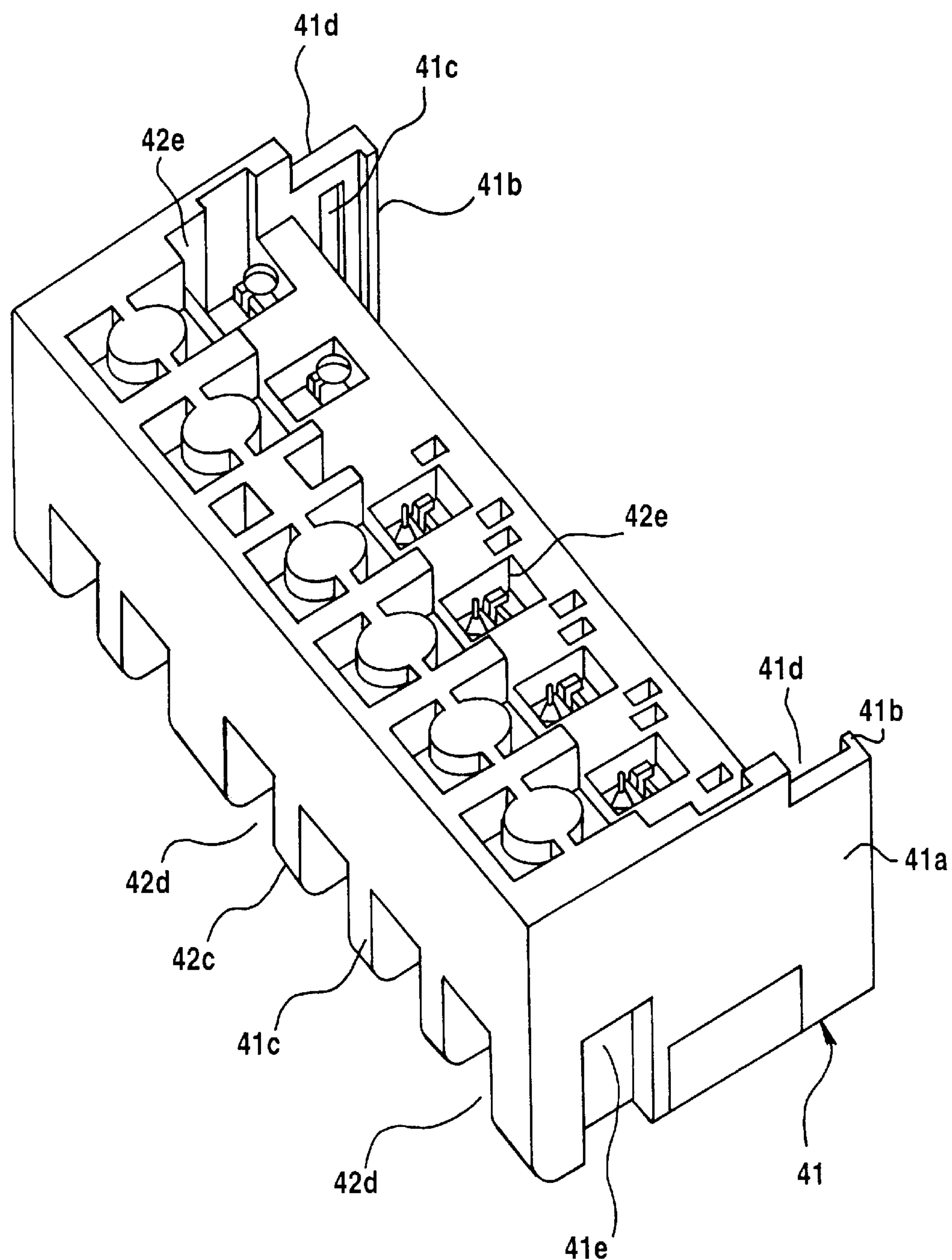
FIG. 8 is a perspective view of the reversed side of the terminal holder.

On the other hand, as shown in FIG. 8, the terminal holder 41 has a generally C-shaped connection body 41*a* with a pair of inwardly protruded guide edges 41*b* and 41*b* formed at the upper edges of the side walls (at the right hand end of the side walls in FIG. 8). Furthermore, the terminal holder 41 has engaging dented portions 41*c* and 41*c* at the inside surfaces of the side walls for engaging said fixing protrusions 31*j* of the inner main casing 31. The connection body 41*a* has cut-out portions 41*d* and 41*d* at the upper rear ends of the connection body 41*a* (at the upper right hand ends of the side walls of the connection body 41*a* in FIG. 8) for fitting the flange portions 31*i* and 31*i*. Therefore, when the terminal holder 41 is slid rearward with the guide edges 41*b* and 41*b* fitted in the guide grooves 31*h* and 31*h*, the engaging protrusions 31*j* and 31*j* are engaged with the engaging dented portions 41c and 41c, resulting in an integral coupling of the inner main casing 31 and the terminal holder 41.

Figure 6:
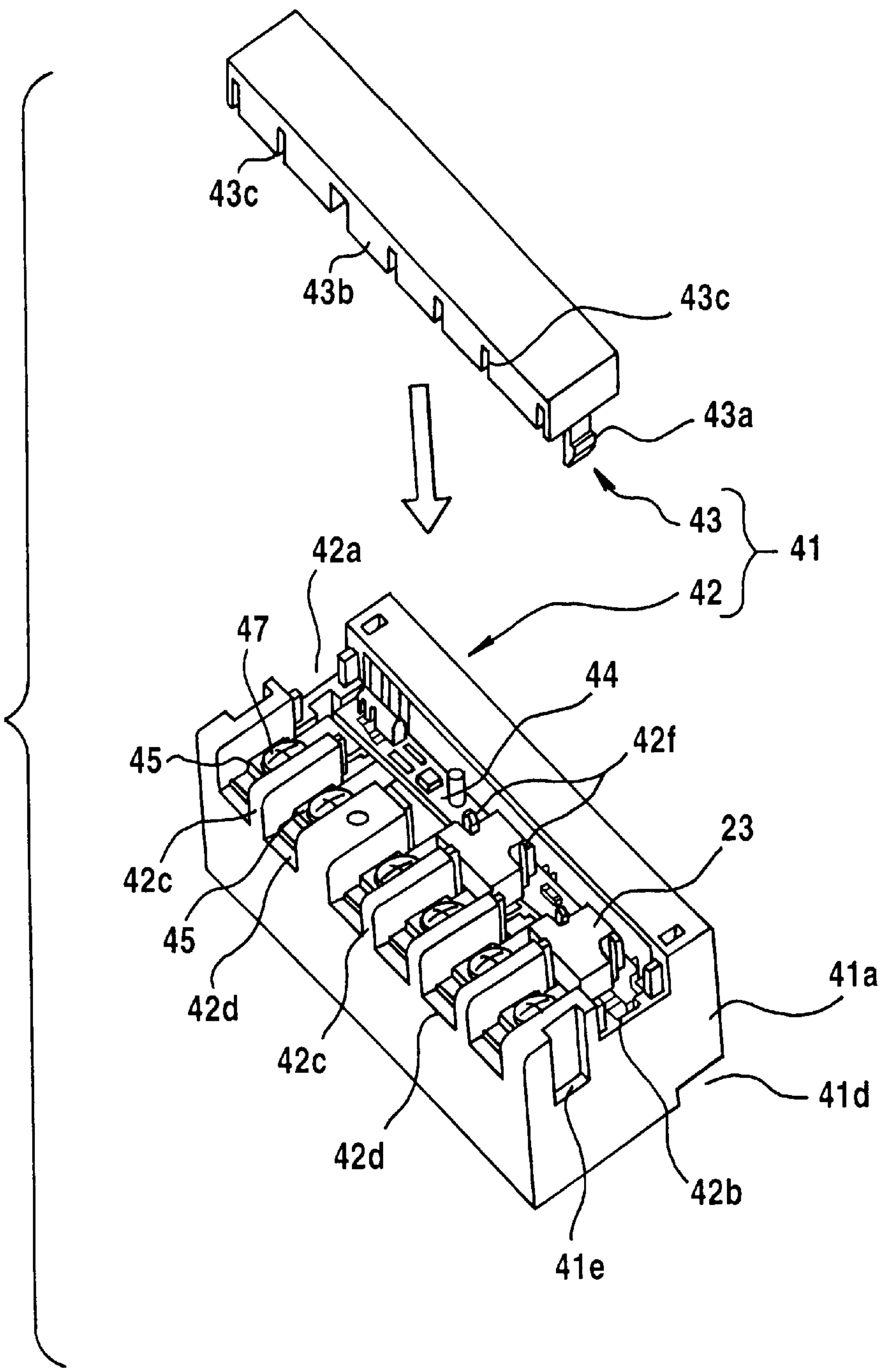
FIG. 6 is a perspective view of a terminal holder in a state that a holder cover is detached from a main terminal holder.
Figure 7:
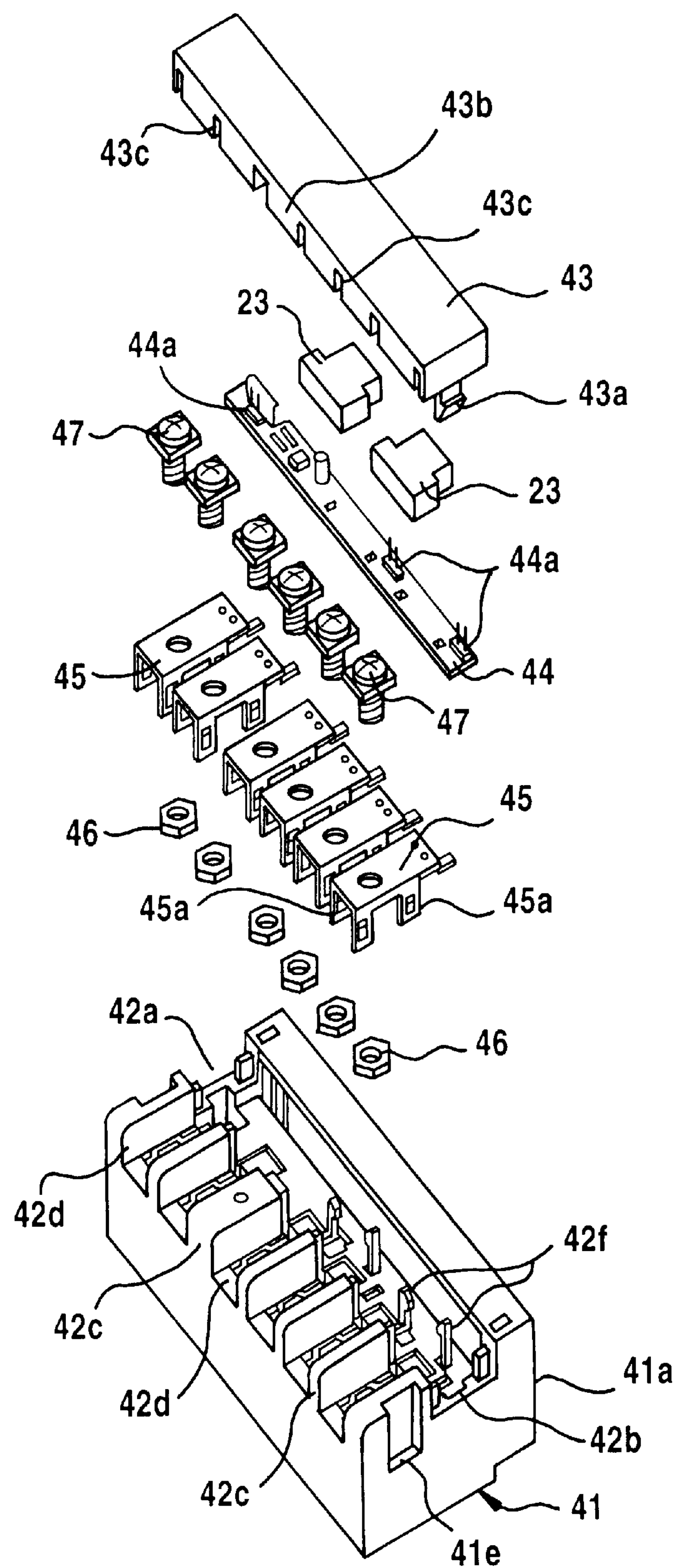
FIG. 7 is an exploded perspective view of the terminal holder.

As shown in FIGS. 6 and 7, the terminal holder 41 includes a main terminal holder 42 and a holder cover 43 disposed on the main terminal holder 42. In detail, the main terminal holder 42 has, at its upper central portion, a central dented portion 42a extending in the longitudinal direction thereof. The central dented portion 42a is covered by the holder cover 43, and is communicated to an inner space of the connection body 41a. The holder cover 43 is provided with a pair of rearwardly protruded engaging ledges 43a and 43a at the longitudinal opposite edges thereof. Thus, the holder cover 43 is connected to the main terminal holder 42 by engaging the engaging ledges 43a with the engaging holes 42b. At the front lower end portion of the main terminal holder 42, a plurality of terminal holding dented portions 42d separated by a plurality of partitions 42c are provided. The holder cover 43 has a partitioning wall 43b having a plurality of slits 43c, and is connected to the main terminal holder 42 such that the partitioning wall 43b is located between the central dented portion 42a and the terminal holding dented portions 42d so as to partition them with the partitions 42c fitted in the slits 43c.

Figure 9:
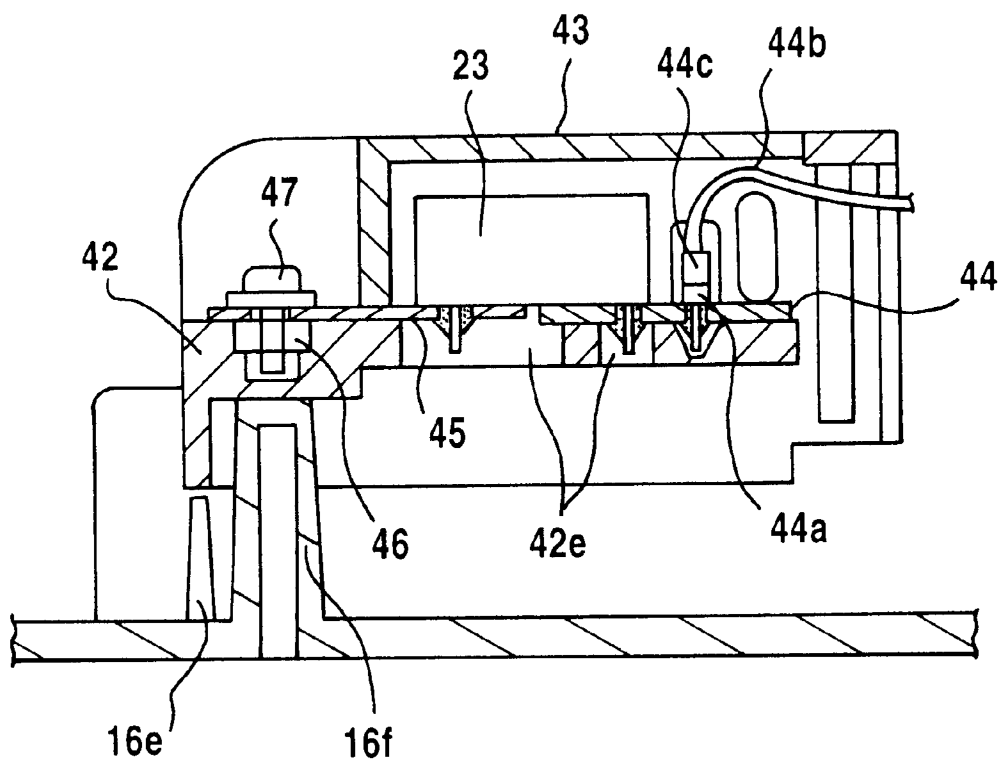
FIG. 9 is a cross-sectional view of the terminal holder.

In the central dented portion 42a, a circuit board 44 is mounted. The circuit board 44 is equipped with two relays 23 and circuit parts driven by a commercial power for driving the relays 23. As shown in FIG. 7, the circuit board 44 is also equipped with a connector (post) 44a for electrically connecting the circuit board 44 to the circuit board 32 mounted to the inner main casing 31. As shown in FIG. 9, the connector 44a is detachably connected by a connector (receptor) 44c provided at an end of electric wire 44b which is connected to the circuit board 32. The circuit board 44 is brazed to terminal boards 45 to which a commercial power is supplied. The terminals of the relays 23 are brazed to another terminal boards 45 to which a load is connected. Each terminal board 45 is disposed in each terminal holding dented portion 42d and fixed to the main terminal holder 42 by engaging one or more terminal bolts 47 with one or more nuts 46 disposed at the bottom of the dented portions 42d. Each terminal board 45 has fixing legs 45a protruding rearward from the right and left side edges thereof as shown in FIG. 7, and fixed to the main terminal holder 42 with the fixing legs 45a inserted into the bottom of the dented portion 42d.

Since the central dented portion 42a and the terminal holding dented portions 42d are partitioned by the partitioning wall 43b of the holder cover 43, electric wires are prevented from contacting to the circuit board 44 when connecting the electric wires to the terminal boards 45. In addition, the circuit board 44 is prevented from being adhered by an alien substance. In the meantime, as shown in FIGS. 8 and 9, the main terminal holder 42 has penetrated openings 42e at its appropriate portions for an easier brazing operation for connecting the terminal board 45 to the circuit board 44 and/or the relays 23.

As is apparent from the structure shown in FIG. 7, since each component to be mounted to the terminal holder 41 is assembled to the main terminal holder 42 from its front side, each component can be attached to the main terminal holder 42 from one direction, which facilitates the assembling operation. In detail, the nuts 46 are attached to the main terminal holder 42. Next, each of the terminal boards 45 is forcibly fitted into each of the terminal holding dented portion 42d, and then the terminal bolts 47 are engaged with the nuts 46. Thereafter, the circuit board 44 is inserted into the central dented portion 42a, and then the relays 23 are attached. Each of the relays 23 is held by a pair of holding ledges 42f and 42f protruded from the bottom of the central dented portion 42a, as shown in FIGS. 6 and 7. At this stage, the main terminal holder 42 is turned over, and the brazing is carried out through the penetrated openings 42e. At this time, functions of the parts mounted to the terminal holder 41 are examined. After the examination, the fabrication of the terminal holder 41 is accomplished by attaching the holder cover 43 on the main terminal holder 42.

Figure 10:
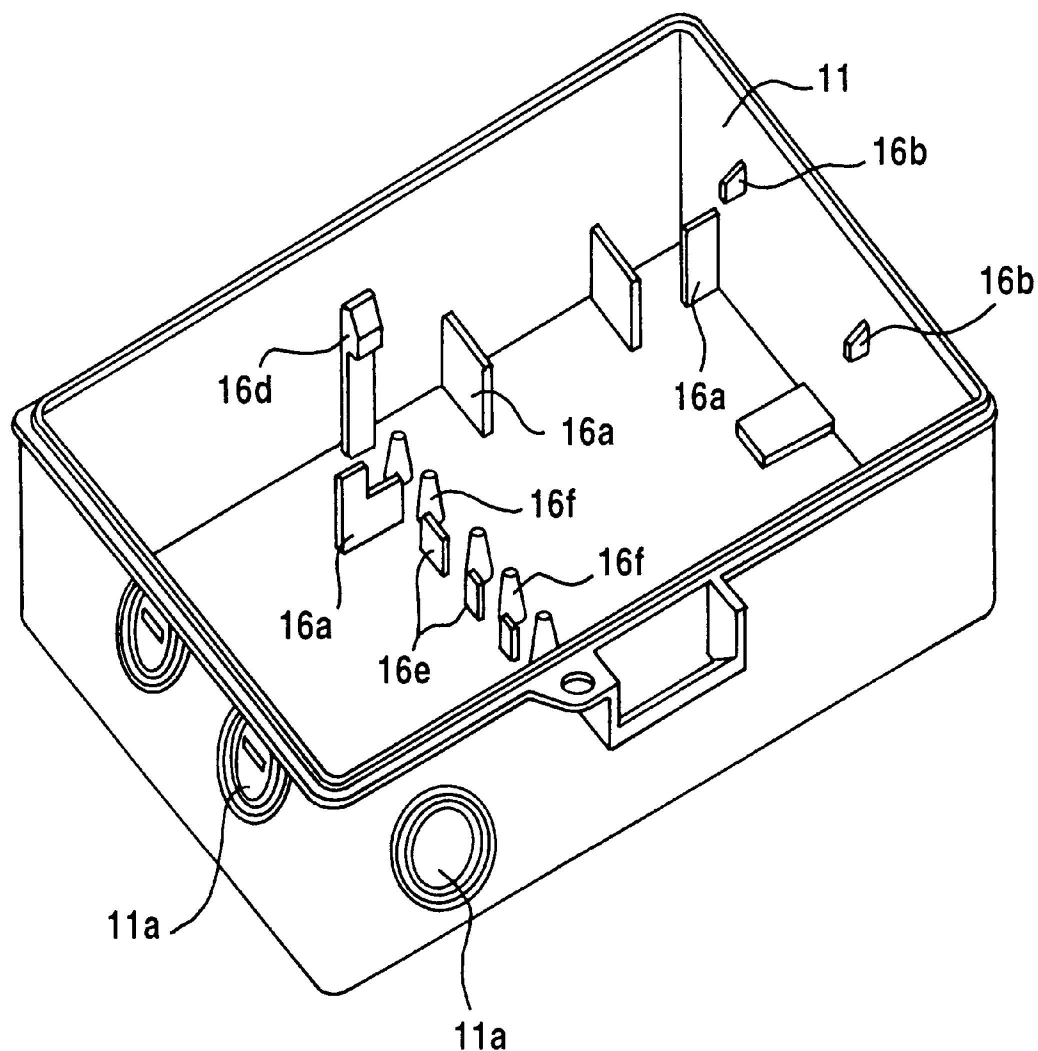
FIG. 10 is a perspective view of the outer main casing.

As mentioned above, the inner casing 15 is formed by integrally connecting the inner main casing 31 and the terminal holder 41, and is accommodated in the outer main casing 11. As shown in FIG. 10, the outer main casing 11 has, at its inner surface of the rear wall, a plurality of supporting ribs 16a on which the inner casing 15 is placed. On the inside surface of the upper wall of the outer main casing 11, a pair of engaging protrusions 16b are formed. Thus, the inner main casing 31 is fixed in the outer main casing 11 by engaging the engaging protrusions 16b with the corresponding engaging protrusions (not shown) formed in the sliding grooves 16c. On the inside surfaces of the right and left side walls of the outer main casing 11, a pair of hooks 16d are formed, whereby the engaging portions of the hooks 16d are engaged with the dented portions 41e each formed on the side upper portion of the terminal holder 41. Thus, the terminal holder 41 is fixed to the outer main casing 11. In other words, the inner casing 15 is fixed to the outer main casing 11 by the engaging protrusions 16b and the hooks 16d. Since the inner casing 15 is supported by the front ends of the supporting ribs 16b, a space is formed between the inner surface of the rear wall of the outer main casing 11 and the rear surface of the inner casing 15. Therefore, a plurality of ribs 16e are formed on the inner surface of the rear wall of the outer main casing 11 so as to seal the gap formed between the inner surface of the rear wall of the outer main casing 11 and the lower rear edge of the terminal holder 41. These ribs 16e prevent an invasion of alien substances into the inner casing 15 through the aforementioned gap although the inner casing 15 has an opened portion at its rear side. The outer main casing 11 has bosses 16f at its inner surface of the rear wall so as to be located at portions corresponding to the terminal bolts 47. Thus, these bosses 16f contact to the rear surface of the terminal holder 41 to support the force imparted to the terminal holder 41 when the terminal bolt 47 is being tightening.

As shown in FIGS. 2 and 10, the outer main casing 11 has knockout portions 11a each having an easy-broken-thin peripheral portion at the lower side walls, lower end wall and the lower end portion of the rear wall. By removing the knockout portions, openings for introducing external wires into the outer main casing 11 can be formed.

In this embodiment, although the inner casing 15 is connected to the outer main casing 11 by the engaging protrusions 16b and the hooks 16d, the inner casing 15 may be connected to the outer main casing 11 by screws, or bolts and nuts. Furthermore, the inner main casing 31 may be connected to the terminal holder 41 by screws or the like. In this embodiments, although the printed circuit board 32 is electrically connected to the circuit board 44 via the connectors 44a and 44c, they may be electrically connected each other directly, i.e., without using the connectors 44a and 44c. Similarly, the battery board 36 may be connected to the printed circuit board 32 without using the connectors 37a and 37b.

Figure 11:
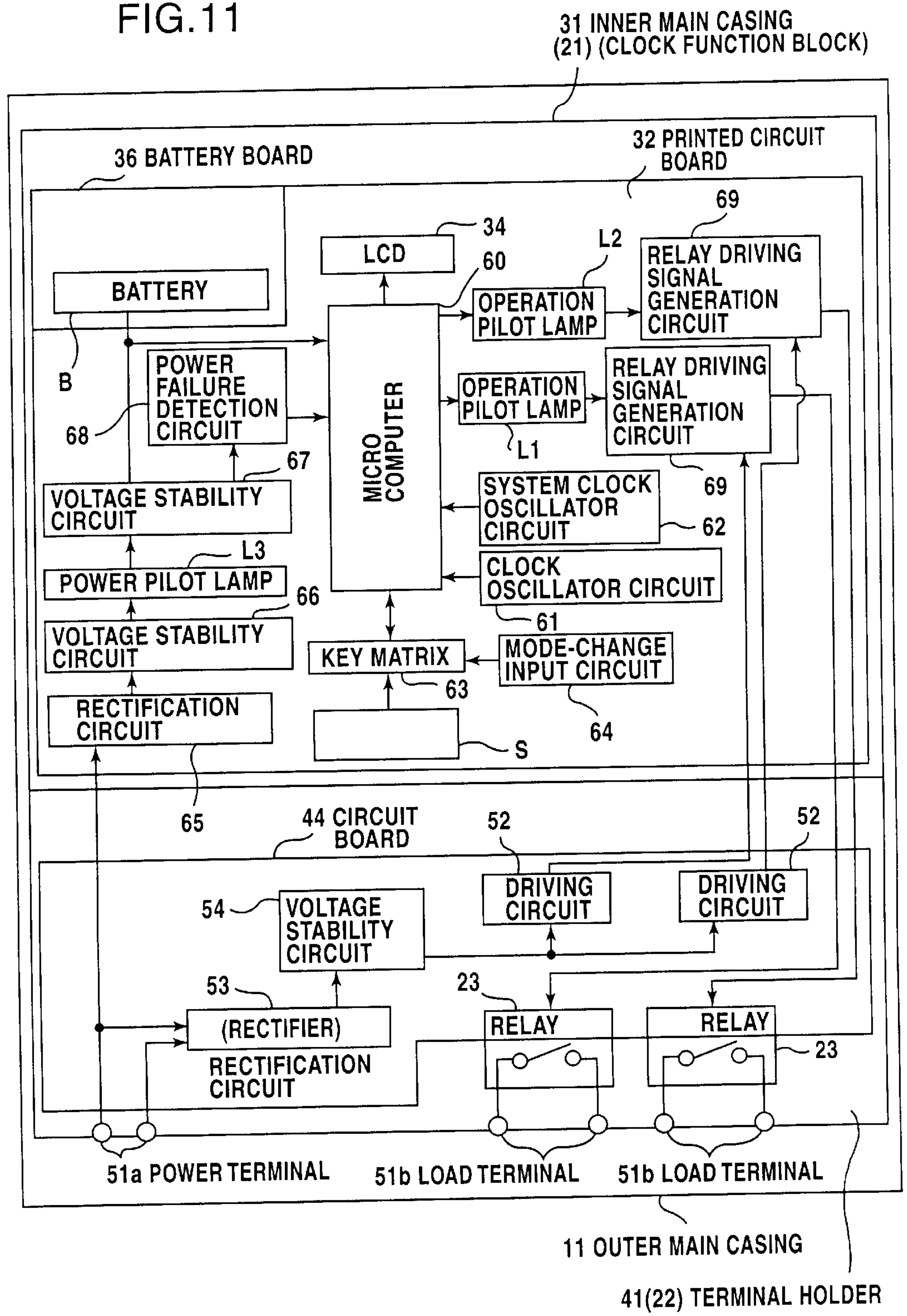
FIG. 11 illustrates a block diagram of the time switch circuit.
Figure 12:
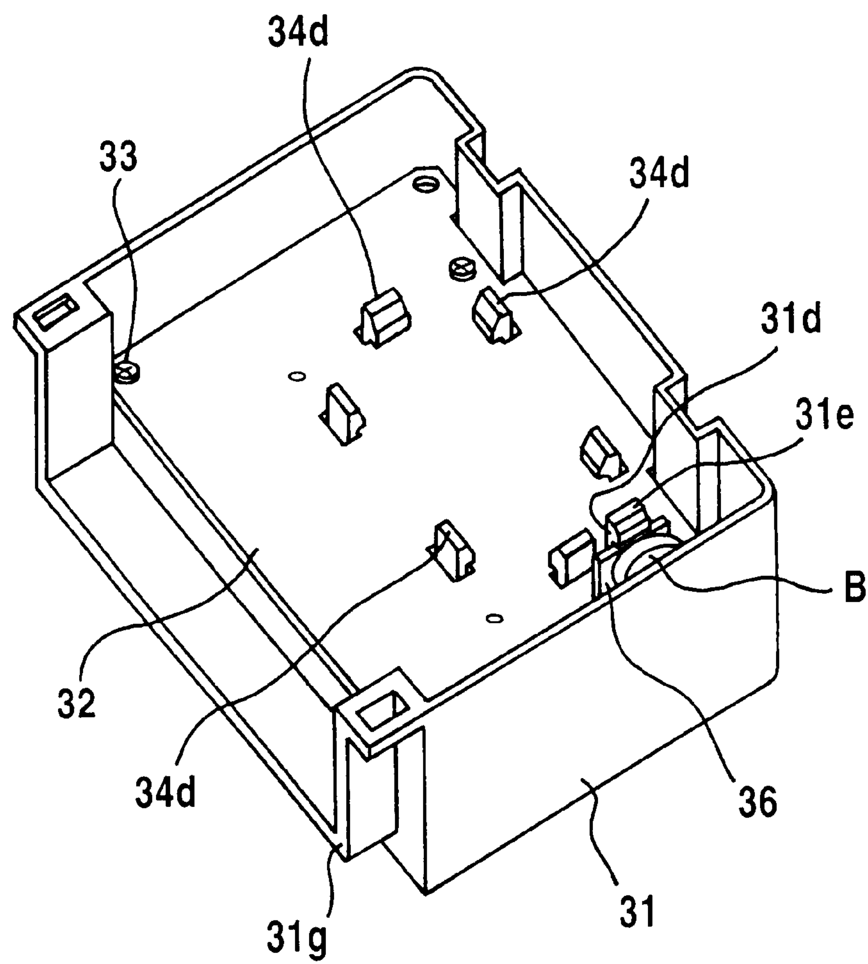
FIG. 12 is a perspective view of an inner main casing according to a second embodiment of the present invention.

FIG. 11 illustrates a circuit structure of this embodiment. FIG. 11 also illustrates the relationship between the inner main casing 31 and the terminal holder 41 and the arrangement of the circuits on the circuit boards 32 and 44 which are mounted in the inner main casing 31 and the terminal holder 41, respectively.

The terminal boards 45 used as power terminals 51*a* are connected to the circuit board 44, and the terminal boards 45 used as load terminals 51*b* are connected to the relays 23. In this embodiment, two relays 23 are provided. Each relay 23 is controlled by a driving circuit 52 equipped to the circuit board 44. Electric power supplied from the commercial power source via the power terminals 51*a* is supplied to the driving circuits 52 by way of the rectification circuit 53 and the voltage stabilizing circuit 54. The rectification circuit 53 and the voltage stabilizing circuit 54 are equipped to the circuit board 44.

The clock function block 21 includes a microcomputer 60 realizing a clock function for clocking the current time and a timer function for setting the time schedule. The microcomputer 60 clocks the current time based on the clock signals supplied from the clock oscillator circuit 61, and is operated based on the clock signals supplied from the system clock oscillator circuit 62. The rubber switches having the operation buttons S are arranged in a matrix arrangement to form the key matrix 63. The key matrix 63 recognizes which operation button S is depressed to obtain operation information, and then supplies the operation information to the microcomputer 60. The microcomputer 60 is controlled by the mode-change input circuit 64 so as to select one of its operation modes. The operation modes include an operation mode for independently controlling two load circuits as in this embodiment, an operation mode for collectively controlling two load circuits, an operation mode for controlling loads based on a weekly time schedule, and an operation mode for controlling loads based on a daily time schedule. In other words, different kinds of programs are installed in the microcomputer 60. One of them is selected by the mode-change input circuit 64, and is executed by the microcomputer 60. Also connected to the microcomputer 60 are the LCD 34, the operation pilot lamps L1, L2, and the power pilot lamps L3. Further connected to the microcomputer 60 is the back-up battery B for supplying a required power to keep both the clock function and the set time-schedule in case of a power failure or the like. The printed circuit board 32 is provided with a rectification circuit 65 connected to the power terminals 51*a*. The pulsating voltage outputted form the rectification circuit 65 is stabilized by the voltage stabilizing circuit 66. The output of the voltage stabilizing circuit 66 turns on the operation pilot lamp L3. The output of the voltage is supplied to the microcomputer 60 via another voltage stabilizing circuit 67 as a power source of the microcomputer 60. The output of the voltage stabilizing circuit 67 is supplied to the power failure detection circuit 68. The power failure detection circuit 68 detects the power failure of the commercial power source based on the drop of the output voltage of the voltage stabilizing circuit 67. When the power failure is detected by the power failure detection circuit 68, the microcomputer 60 stops all functions other than the functions required to be kept working even in a power failure such as a clock function. When the commercial power source is restored, the microcomputer 60 detects the restoration and resumes all of the functions. Since the back-up battery B supplies the electric power to the limited functions required to be kept operational during the power failure, only a very small amount of electric power is consumed during the power failure. As a result, if a lithium battery or the like is used as the back-up battery B, it is not required to replace it with a new one for ten years or more.

When the time schedule set in the microcomputer 60 is executed by operating the operation buttons S, the microcomputer 60 supplies an instruction to the relay driving signal generation circuit 69 when the current time comes to coincide with the set time of the time schedule. Then, a driving signal is output from the relay driving signal generation circuit 69 driven by the driving circuit 52 to control the relay 23. In this embodiment, since two relay driving signal generation circuits 69 are provided for individually controlling the relays 23, two load circuits can be controlled separately. Thus, each output state of the relays 23 can be selected by the two switches SW1 and SW2.

Second Embodiment

In the first embodiment, the battery board 36 is fixed to the is inner main casing 31 by the holding ribs 31 and the printed circuit board 32. However, in the second embodiment, the battery board 36 is fixed to the inner main casing 31 by utilizing a fixing hook 31*e* protruded from the inner surface of the front wall of the inner main casing 31, instead of utilizing the printed circuit board 32. In detail, the fixing hook 31*e* is a modification of the holding rib 31*d* of the first embodiment. Namely, the fixing hooks 31*e* is formed to have a leg portion higher than the holding rib 31*d* of the first embodiment and a hooking arm at the tip end of the leg portion so that the battery board 36 can be held between the inner surface of the side wall of the inner main casing 31 and the fixing hooks 31*e*. Similar to the first embodiment, the printed circuit board 32 has a cut-out portion 32*c* which coincides with the battery board 36 at the side edge thereof. The battery board 36 is fitted in the cut-out portion 32*c* so as to abut to the opposing edges of the cut-out portion 32*c*, whereby the battery board 36 is prevented from being displaced. In this embodiment, since the battery board 36 is engaged with the fixing hook 31*e* formed on the inner main casing 31, the positioning of the battery board 36 can be performed easily, and the fixing of the battery board 36 to the inner main casing 31 can be enhanced.

In this embodiment, although the fixing structure of the battery board 36 to the inner main casing 31 is different from that in the first embodiment, the other structure and the operation are the same as in the first embodiment.

Third Embodiment

Figure 13:
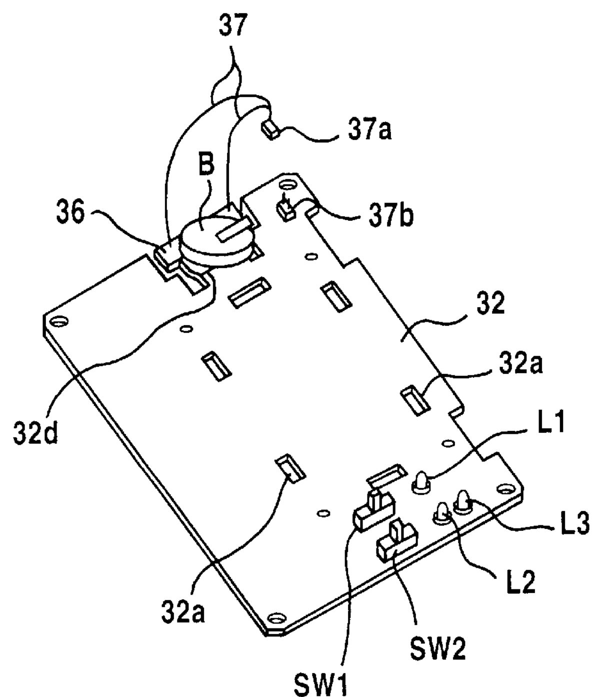
FIG. 13 is a perspective view of the circuit board and the battery board of a third embodiment of the present invention.
Figure 14:
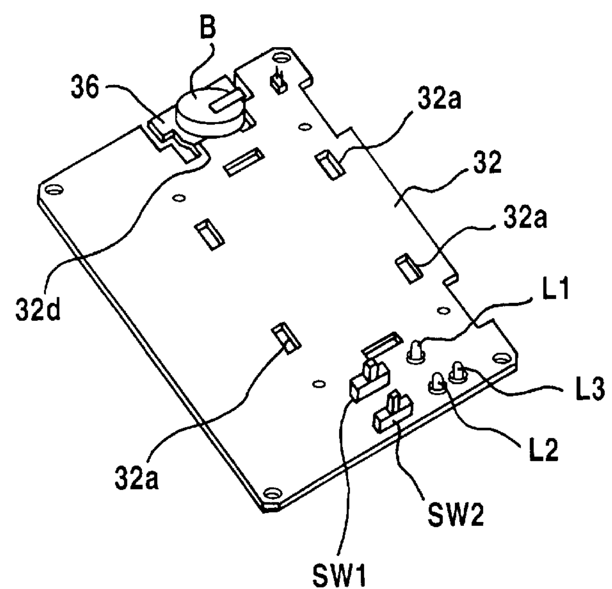
FIG. 14 is a perspective view of the circuit board and the battery board of a fourth embodiment of the present invention.
Figure 15:
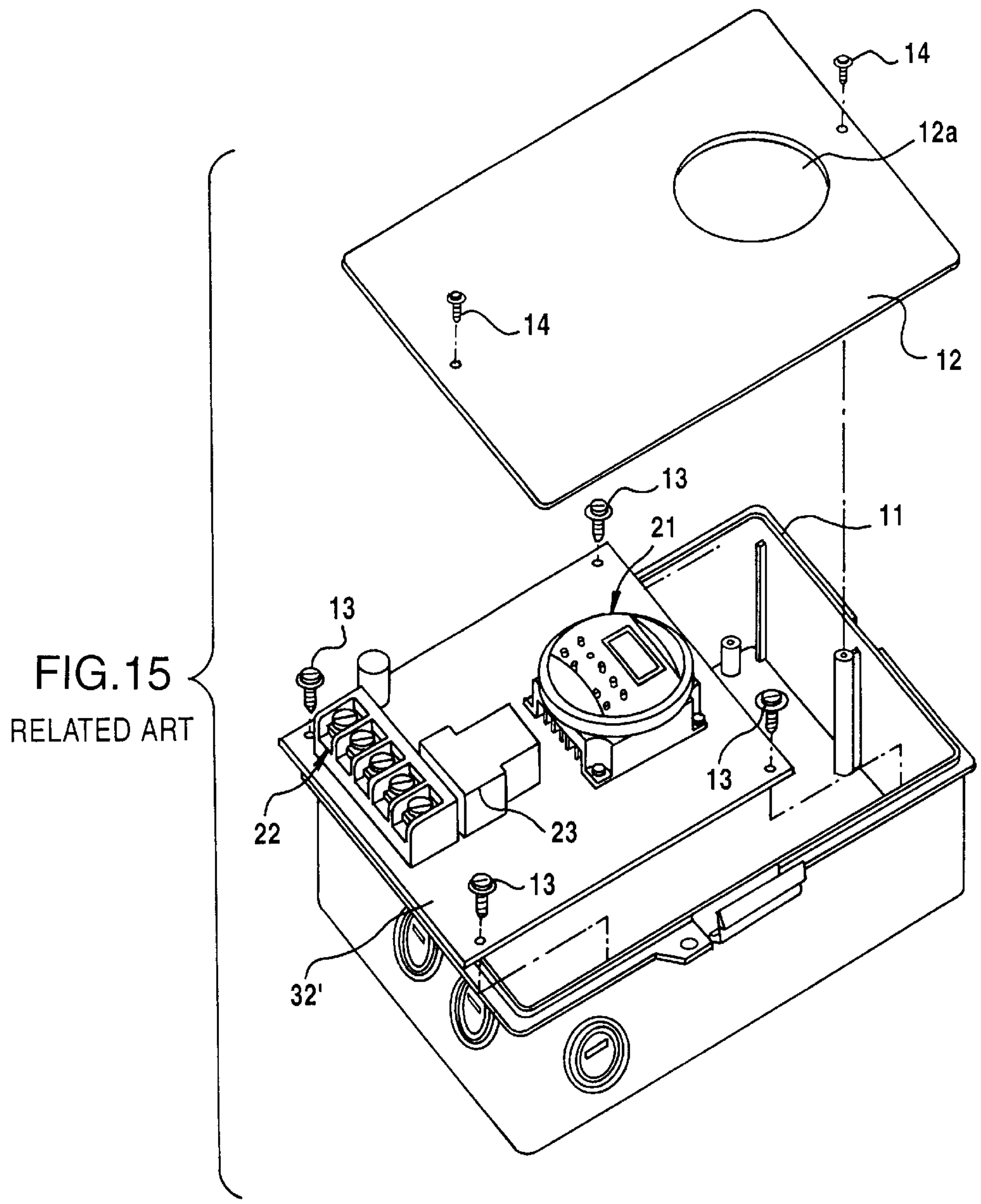
FIG. 15 is a perspective view of a conventional time switch as a related art in a disassembled state.
Figure 16:
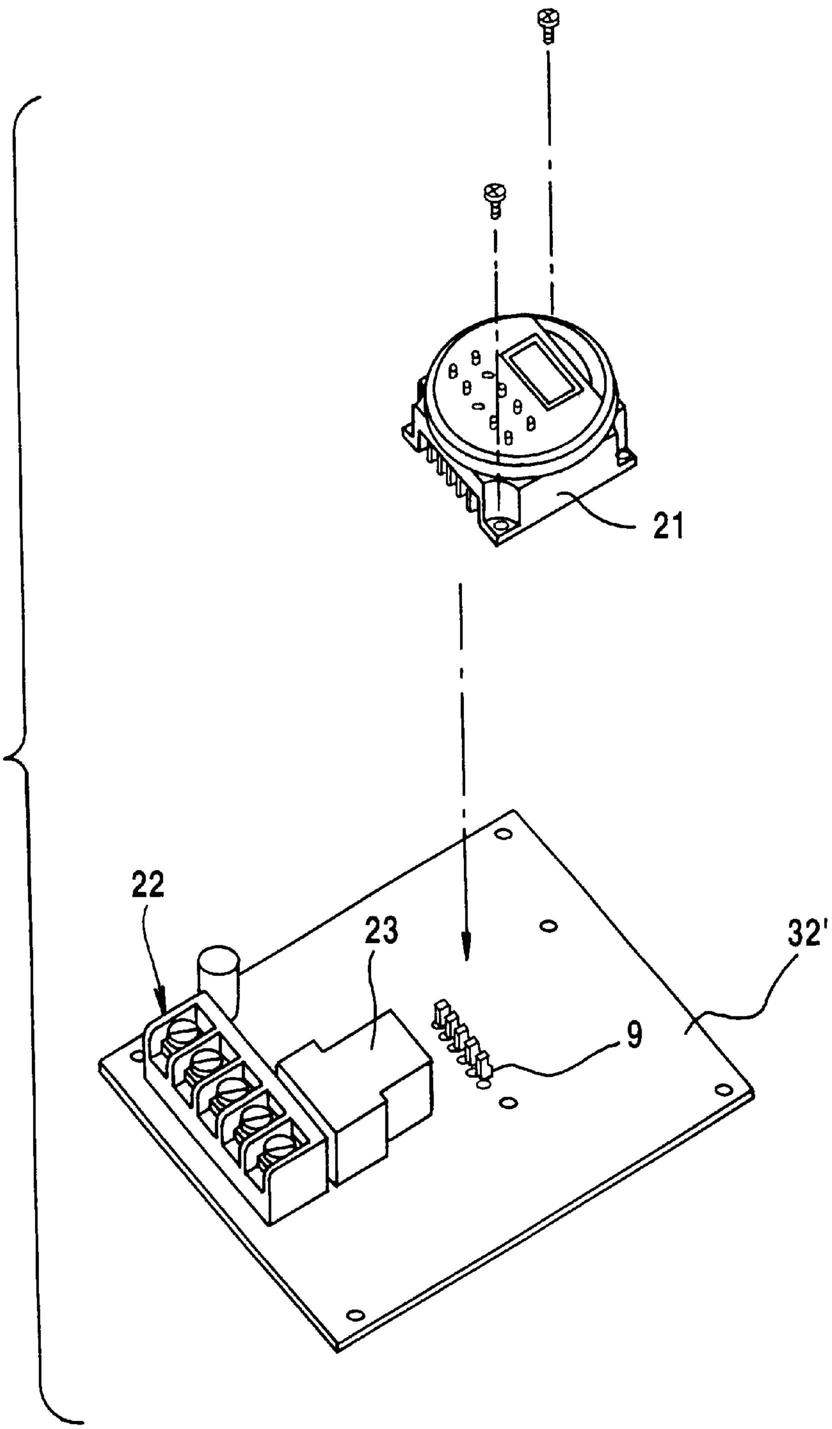
FIG. 16 is a perspective view of a clock function block and a printed circuit board of the conventional time switch in a disassembled state.
Figure 17:
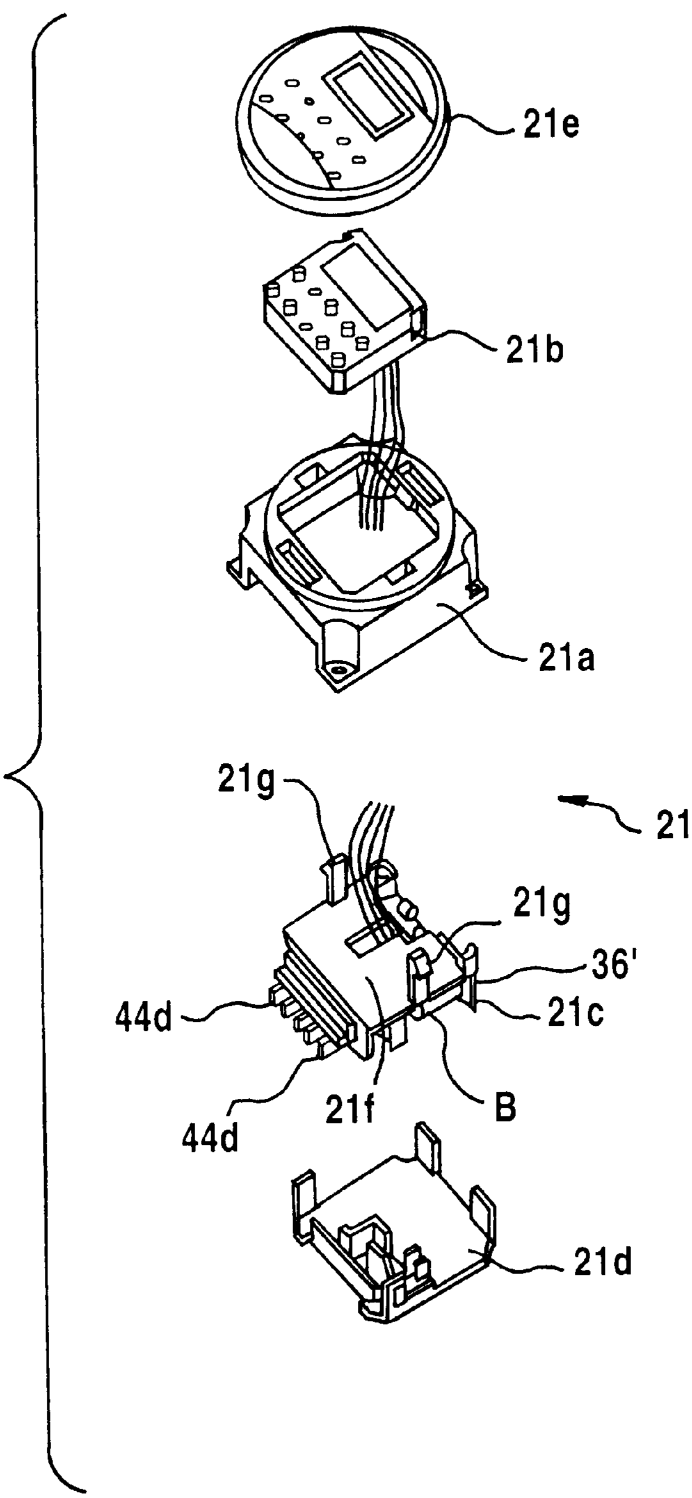
FIG. 17 is an exploded perspective view of the clock function block of the conventional time switch.
Figure 18:
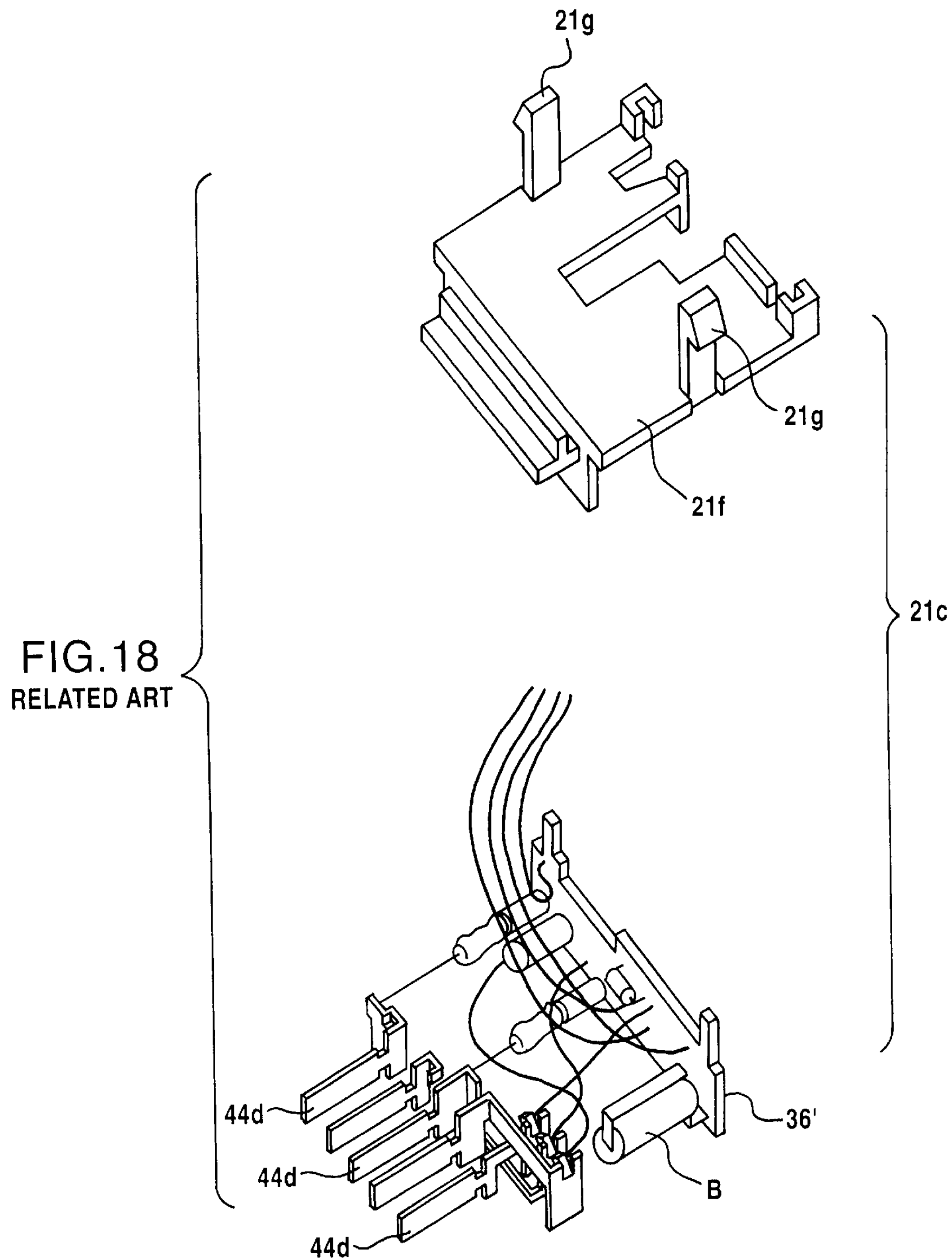
FIG. 18 is a perspective view showing the holding plate, terminals and battery fixing board with a battery of the conventional time switch in a disassembled state.

In the first and second embodiments, the battery board 36 is a member separated from the printed circuit board 32. However, in the third embodiment, as shown in FIG. 13, the battery board 36 is integrally formed to the circuit board 32. In detail, the battery board 36 is connected to the circuit board 32 at one side edge of the battery board 36 via a straight easy-to-break portion 32*d*. The easy-to-break portion 32*d* has a V-shaped groove in cross-section so that the battery board 36 can easily be broken to be detached from the circuit board 32. Like the first embodiment, the battery board 36 is electrically connected to the circuit board 32 by way of the wires 37. Thus, in cases where the time switch is to be disposed, the battery board 36 can be detached from the circuit board 32 by breaking the easy-to-break portion 32*d* and detaching the wires 37 from the circuit board 32. Since the wires 37 are provided with connectors 37*a* detachably connected to the circuit board 32, the wires 37 can be detached from the circuit board 32 easily.

According to the third embodiment, since the battery board 36 is integrally connected to the circuit board 32, these boards can be easily manufactured. However, the battery board 36 may be obtained by detaching the battery board 36 initially manufactured together with the circuit board 32 as an one-piece board so that the detached battery board 36 is secured to the inner main casing 31 as in the first embodiment. In the latter case, since the battery board 36 is manufactured so as to be integral with the circuit board 32, these boards can be easily manufactured. In the third embodiment, although the easy-to-break portion 32*d* has a V-shaped groove in cross-section so that the battery board 36 can easily be broken so that the battery board 36 can be detached from the circuit board 32. Instead of the V-shaped groove, a plurality of penetrated holes or apertures forming a line may be employed as the easy-to-break portion 32*d*. The other structures and operations are the same as in the first embodiment.

Fourth Embodiment

In this embodiment, printed conductive patterns (not shown) are used instead of the electric wires 37 as in the third embodiment. In this embodiment, the easy-to-break portion 32*d* is formed so as to across the printed patterns. However, in a case where a V-shaped groove is formed as the easy-to-break portion 32, the V-shaped groove should be formed on the rear side of the boards.

According to this embodiment, the printed conductive patterns are cut when the battery board 32 is detached from the circuit board 32. In this embodiment, instead of the V-shaped groove, a plurality of penetrated holes or apertures forming a line may be employed as the easy-to-break portion 32*d*. Other structures and operations are the same as in the first embodiment.

According to the first aspect of the present invention, a time switch includes a circuit board equipped with a time switch circuit operated by a commercial power source, a battery board to which a back-up battery for supplying a back-up power to the circuit board in case of an interruption of a power supply from the commercial power supply is mounted, and a casing in which the circuit board and the battery board are mounted, wherein the battery board is a member separated from the circuit board. With this time switch, since the battery board is a member separated from the circuit board, a replacement or disposal of the back-up battery can be easily performed by detaching the battery board from the circuit board.

It is preferable that the battery board is held therebetween by the circuit board and the casing. This enables an easy fixing of the battery board to the casing without using another fixing part.

It is preferable that the battery board has a fixing ledge and the casing has a fixing hook for fixing the battery board to an inside surface of the casing by engaging the battery board. In this case, the positioning of the battery board can be performed easily and the fixing strength of the battery board can be enhanced.

It is preferable that the battery board is formed by detaching a part of the circuit board. In this case, the manufacturing of the battery board can be easily performed.

In the aforementioned time switch, it is preferable that the circuit board has a clock function for clocking a current time and a time-schedule setting function for setting a time-schedule, and includes a load controlling circuit for controlling a load connected to the time switch when the current time comes to coincide with the set time schedule, and wherein the back-up battery supplies a back-up power for keeping the clock function and the time schedule setting function in case of the interruption of the power supply from the commercial power supply.

It is preferable that the casing includes a main casing in which the circuit board and the battery board are mounted and a terminal holder having a terminal block for connecting a commercial power source and a load, the clock function block having the clock function and the time-schedule setting function and generating a signal for driving a relay for controlling the load when the current time comes to coincide with the time-schedule set by a user, the main casing being detachably connected to the terminal holder, wherein the circuit board includes a first circuit board equipped with parts constituting the clock function block and a second circuit board equipped with parts for driving the relay, wherein the first circuit block and the battery board are mounted in the main casing, and wherein the battery board is held by and between an inner surface of the main casing and the first circuit board. With this construction, since the clock function block is mounted in the main casing, the clock function block can be prevented from being exposed when electric wires are connected to the terminal block, resulting in a reduced possibility of adhering of alien substances and a reduced possibility of breakage of the clock function block. Furthermore, since the clock function, an operation test of the clock function block can be performed at the time of designing the clock function block. This can eliminate the test of the terminal block, resulting in reduced steps of testing. In addition, the terminal block can be used for various types of clock function blocks. Since the battery block is held by and between the inner surface of the casing and the first circuit board equipped with parts constituting the clock function block, the battery board can be fixed to the casing by fixing the first circuit board to the casing without using another parts. This results in a reduced number of parts.

According to another aspect of the present invention, a time switch includes a circuit board equipped with a time switch circuit operated by a commercial power source, a battery board to which a back-up battery for supplying a back-up power to the circuit board in case of an interruption of a power supply from the commercial power source is mounted, and a casing in which the circuit board and the battery board are mounted, wherein the battery board is connected to the circuit board by way of an easy-to-break portion having a relatively weak mechanical strength.

With this time switch, since the battery board is connected to the circuit board by way of an easy-to-break portion, the manufacturing thereof can be easily performed. Furthermore, since the battery board can easily be detached from the circuit board by breaking the easy-to-break portion, a disposal of the back-up battery can easily be performed.

It is preferable that the easy-to-break portion is a groove formed along a boundary between the battery board and the circuit board. In this case, the battery board can be easily detached from the circuit board by breaking along the groove. The groove may have a generally V-shaped cross-sectional shape.

It is preferable that the time switch circuit has a clock function for clocking a current time and a time-schedule setting function for setting a time-schedule, and includes a load controlling circuit for controlling a load connected to the time switch when the current time comes to coincide with the set time-schedule, and wherein the back-up battery supplies a back-up power for keeping the clock function and the time schedule setting function in case of the interruption of the power supply from the commercial power source.

It is preferable that the battery board is electrically connected to the circuit board by way of electric wires. In this case, the battery board can be easily detached from the circuit board by cutting the wire.

It is preferable that the battery board is electrically connected to the circuit board by way of conductive printed patterns formed on the boards.

The easy-to-break portion may be a groove formed along a boundary between the battery board and the circuit board, wherein the battery board is electrically connected to the circuit board by way of conductive printed circuit patterns formed on one side of the boards so as to bridge them, and wherein the groove is formed on the other side of the boards.

The terms and expressions which have been employed herein are used as terms of description and not of limitations, and there is no intent, in the use of such terms and expressions, of excluding any equivalents of the features shown and described or portions thereof, but it should be recognized that various modifications are possible within the scope of the invention claimed.

This application claims priority of Japanese Patent Application No. Hei 11-3393 filed on Jan. 8, 1999, the disclosure of which is incorporated by reference in its entirety.

What is claimed is:

1. A time switch, comprising:

a circuit board equipped with a time switch circuit operated by a commercial power source;

a battery board to which a back-up battery for supplying a back-up power to said circuit board in case of an interruption of a power supply from the commercial power source is mounted; and a casing in which said circuit board and said battery board are mounted, wherein said battery board is a member separated from said circuit board, wherein said battery board has a fixing ledge and said casing has a holding rib having a slot, wherein said fixing ledge is fitted in said slot and clumped by and between said holding rib and said circuit board, whereby said battery board is detachably held by and between said circuit board and said casing, and wherein said battery board is electrically connected to said circuit board via connectors detachably connected with each other.

2. The time switch as recited in claim 1, wherein said casing has a hook at an inside surface thereof for engaging said battery board so as to fix said battery board to said casing.

3. The time switch as recited in claim 1, wherein said battery board is formed by detaching a part of said circuit board.

4. The time switch as recited in claim 1, wherein said time switch circuit has a clock function for clocking a current time and a time-schedule setting function for setting a time-schedule, and includes a load controlling circuit for controlling a load connected to said time switch when the current time comes to coincide with the set time-schedule, and wherein said back-up battery supplies a back-up power for keeping the clock function and the time-schedule setting function in case of the interruption of the power supply from the commercial power source.

5. The time switch as recited in claim 4, wherein said casing includes a main casing in which said circuit board and said battery board are mounted and a terminal holder having a terminal block for connecting a commercial power source and a load, said clock function block having the clock function and the time-schedule setting function and generating a signal for driving a relay for controlling the load when the current time comes to coincide with the time-schedule set by a user, said main casing being detachably connected to said terminal holder, wherein said circuit board includes a first circuit board equipped with parts constituting said clock function block and a second circuit board equipped with parts for driving said relay, wherein said first circuit board and said battery board are mounted in said main casing, and wherein said battery board is held by and between an inner surface of said main casing and said first circuit board.

* * * * *